(12) United States Patent
Lee et al.

(10) Patent No.: US 12,249,555 B2
(45) Date of Patent: Mar. 11, 2025

(54) SEMICONDUCTOR DEVICE PACKAGE INCLUDING A THERMAL CONDUCTIVE LAYER AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Taipei (TW); Cherng-Shiaw Tsai, New Taipei (TW); Shao-Kuan Lee, Kaohsiung (TW); Hsiao-kang Chang, Hsinchu (TW); Hsin-Yen Huang, New Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

(21) Appl. No.: 17/380,360

(22) Filed: Jul. 20, 2021

(65) Prior Publication Data

US 2022/0310477 A1    Sep. 29, 2022

Related U.S. Application Data

(60) Provisional application No. 63/166,176, filed on Mar. 25, 2021.

(51) Int. Cl.
*H01L 23/373*    (2006.01)
*H01L 21/768*    (2006.01)
(Continued)

(52) U.S. Cl.
CPC ...... *H01L 23/373* (2013.01); *H01L 21/76802* (2013.01); *H01L 23/49811* (2013.01); *H01L 23/49838* (2013.01); *H01L 24/14* (2013.01)

(58) Field of Classification Search
CPC .............. H01L 23/373; H01L 21/76802; H01L 21/76898; H01L 25/043; H01L 25/0657
See application file for complete search history.

(56) References Cited

U.S. PATENT DOCUMENTS 5,880,010 A * 3/1999 Davidson ................ H01L 24/26
257/E21.705
9,000,584 B2    4/2015 Lin et al.
(Continued)

*Primary Examiner* — Phat X Cao
(74) *Attorney, Agent, or Firm* — NZ Carr Law Office

(57) ABSTRACT

A semiconductor device package, along with methods of forming such, are described. The semiconductor device package includes a first semiconductor device structure having a first substrate, two first devices disposed on the first substrate, a first interconnection structure disposed over the first substrate and the two first devices, and a first thermal feature disposed through the first substrate and the first interconnection structure. The semiconductor device package further includes a second semiconductor device structure disposed over the first semiconductor device structure having a second interconnection structure disposed over the first interconnection structure, a second substrate disposed over the second interconnection structure, two second devices disposed between the second substrate and the second interconnection structure, and a second thermal feature disposed through the second substrate and the second interconnection structure. The second thermal feature is in contact with the first thermal feature.

20 Claims, 21 Drawing Sheets

(51) Int. Cl.
    *H01L 23/00*     (2006.01)
    *H01L 23/498*     (2006.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0146193 A1* | 6/2012 | Stuber ............... H01L 23/3677 438/584 |
| 2014/0054761 A1* | 2/2014 | Lin ..................... H01L 23/42 257/692 |

\* cited by examiner

SEMICONDUCTOR DEVICE PACKAGE INCLUDING A THERMAL CONDUCTIVE LAYER AND METHODS OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of a substrate, such as the semiconductor wafer. Although dramatic improvement in lithography has resulted in considerable improvement in 2D integrated circuit (IC) formation, there are physical limits to the density that may be achieved in two dimensions. One of these limits is the minimum size needed to make these components. In addition, when more devices are put into one chip or die, more complex designs are required.

In an attempt to further increase circuit density, three-dimensional integrated circuits (3DICs) have been investigated. In a typical formation process of a 3DIC, two or more chips or substrates are bonded together. However, performance and reliability of 3DICs may be negatively impacted at high temperature. Therefore, there is a need for 3DICs having improved heat dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
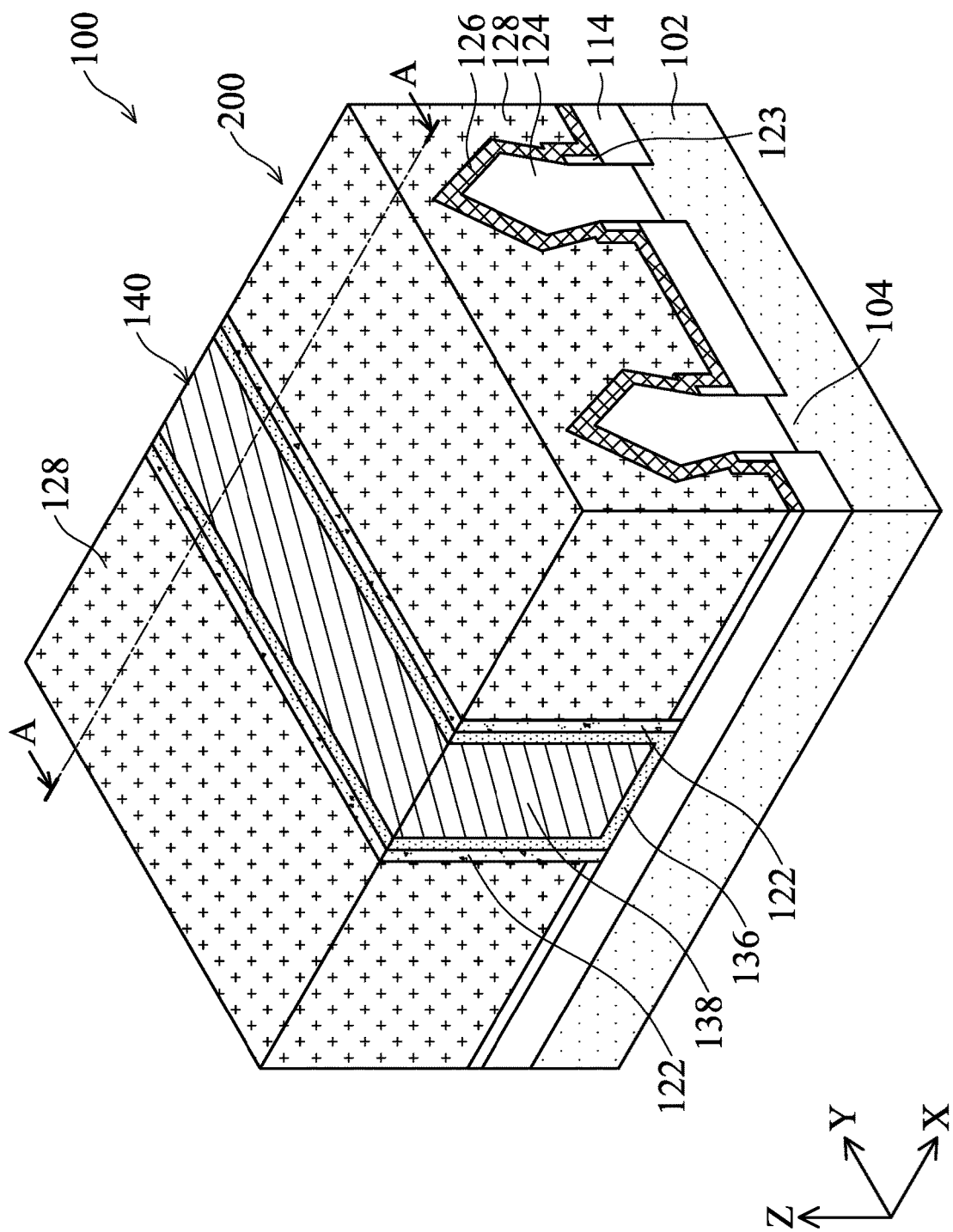
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
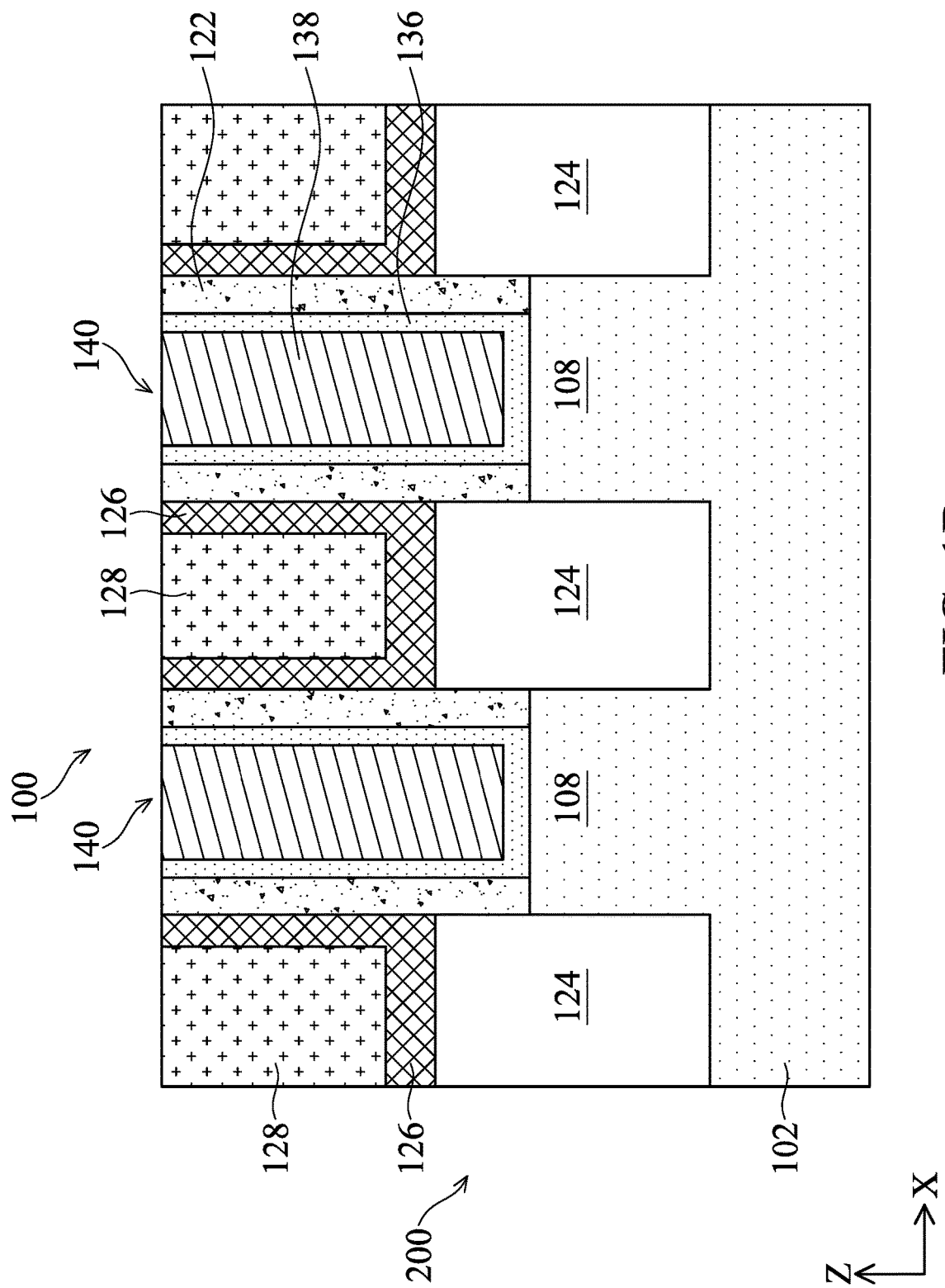
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and a plurality of S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of the S/D regions 124, and the fin sidewall spacers 123 may include the same material as the gate spacers 122. Portions of the gate stacks 140, the gate spacers 118, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
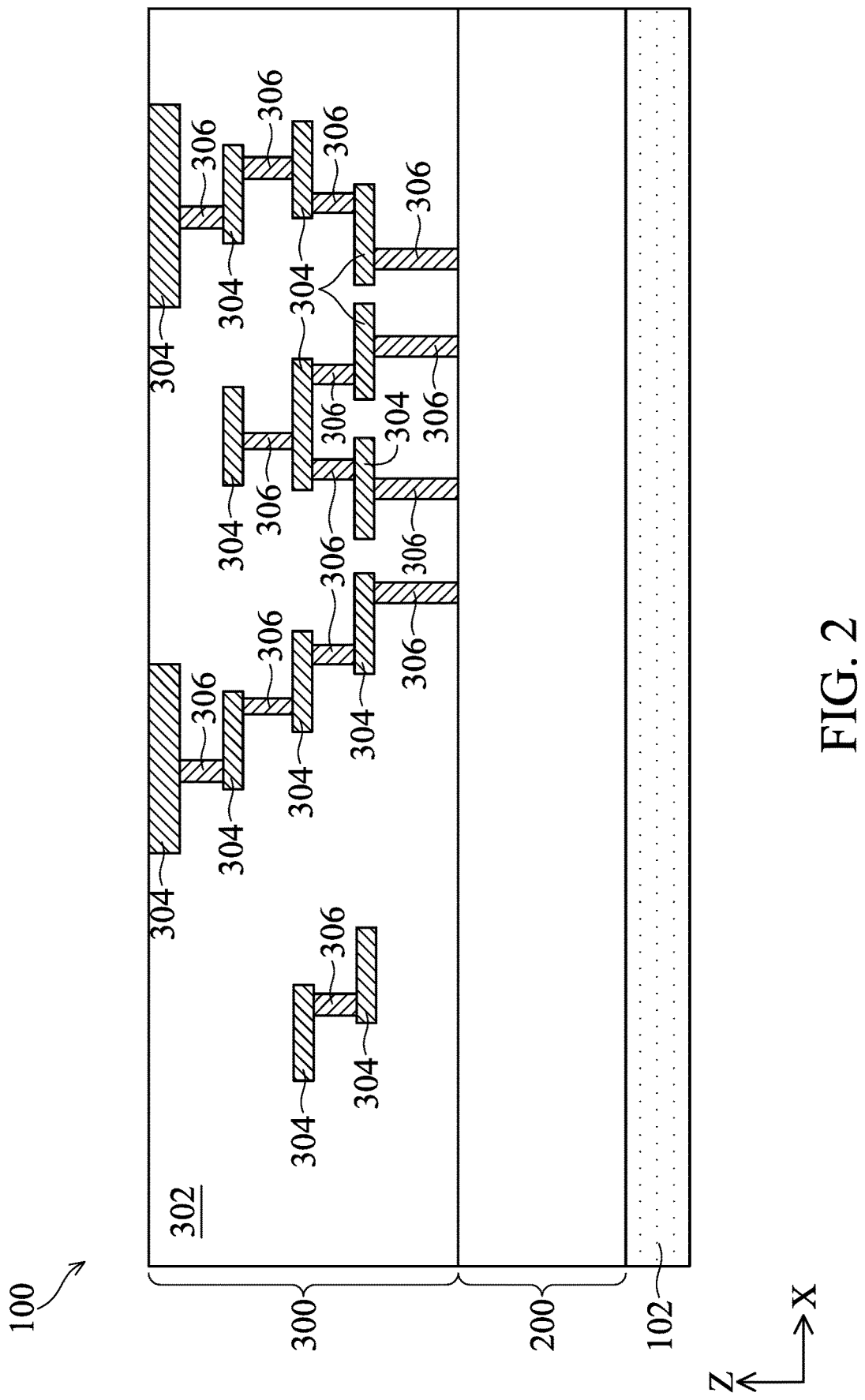
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

Figure 3A:
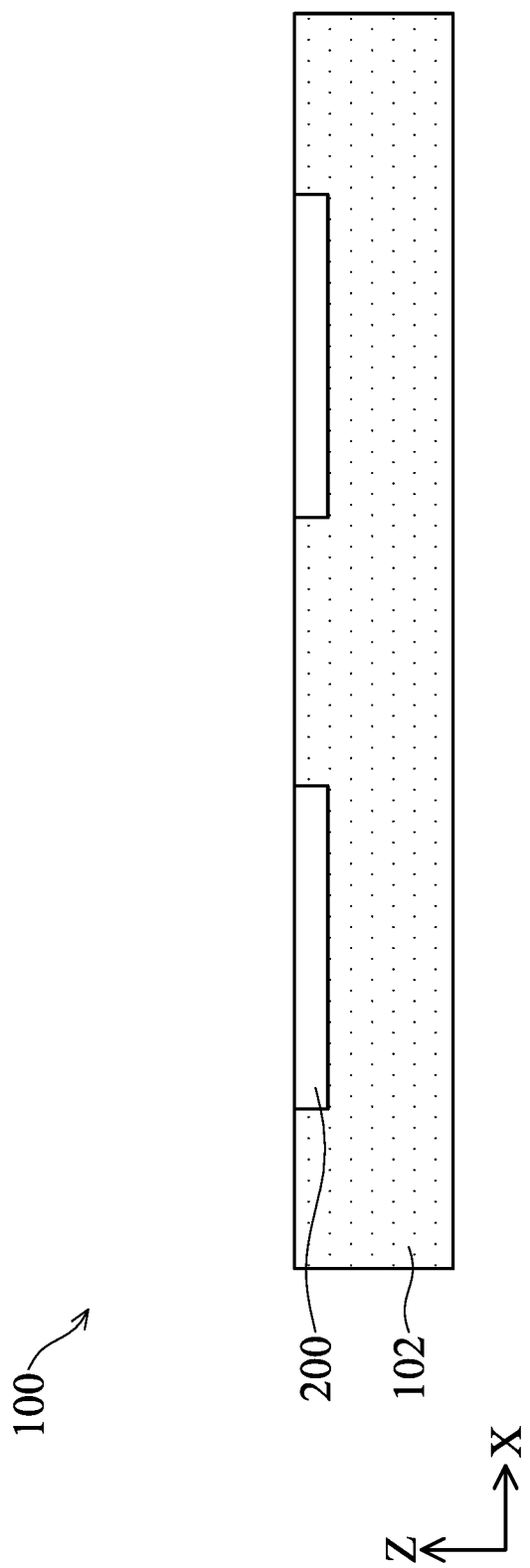
FIGS. 3A-3F are cross-sectional side views of various stages of manufacturing the semiconductor device structure, in accordance with some embodiments.

FIGS. 3A-3F are cross-sectional side views of various stages of manufacturing the semiconductor device structure 100, in accordance with some embodiments. As shown in FIG. 3A, the devices 200 are formed on the substrate 102. As described above, the devices 200 may be any suitable devices, such as transistors, diodes, imaging sensors, resistors, capacitors, inductors, memory cells, or a combination thereof. In some embodiments, the devices 200 are transistors, such as planar FETs, FinFETs, nanostructure transistors, or other suitable transistors. The nanostructure transistors may include nanosheet transistors, nanowire transistors, GAA transistors, MBC transistors, or any transistors having the gate electrode surrounding the channels. In some embodiments, the devices 200 are logic devices, memory devices, or CMOS.

Figure 3B:
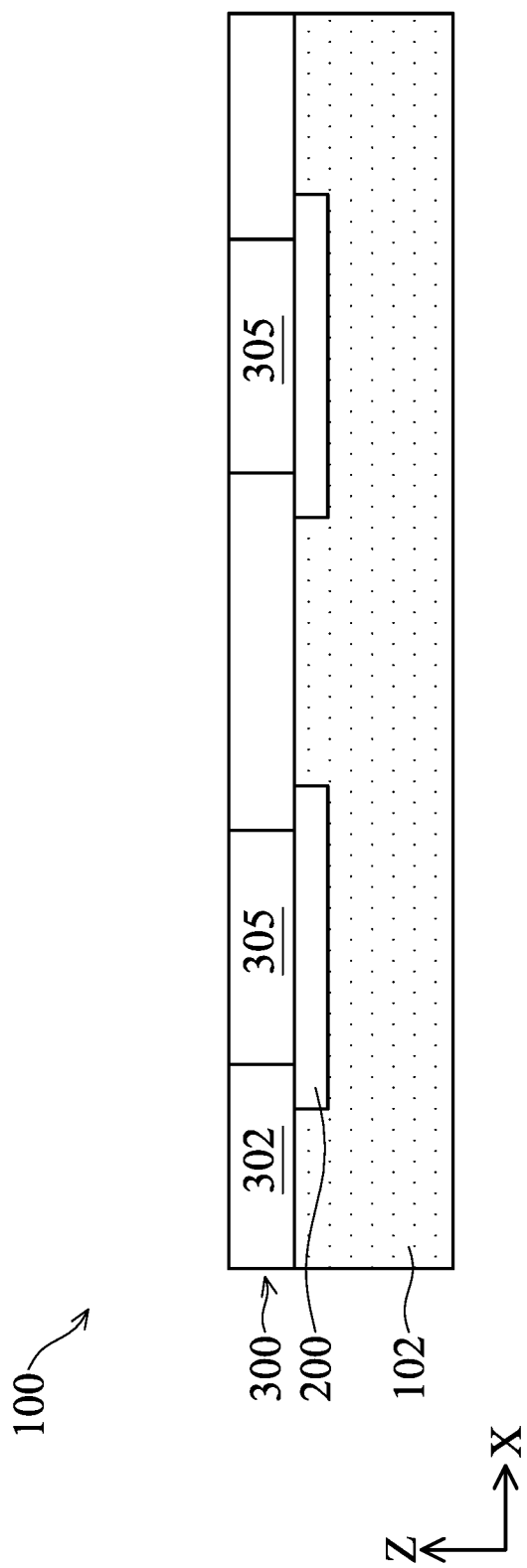

As shown in FIG. 3B, the interconnection structure 300 is formed over the substrate 102 and the devices 200. The interconnection structure 300 includes the IMD layer 302 and conductive features 305 formed in the IMD layer 302. The conductive features 305 may be the conductive features 304, 306 shown in FIG. 2. In some embodiments, the interconnection structure 300 includes a layer of IMD layer 302 and a plurality of conductive features 305 formed in the IMD layer 302. In some embodiments, the interconnection structure 300 includes a plurality of IMD layers 302 and the conductive features 304, 306 formed therein, as shown in FIG. 3. The conductive features 305 may be electrically connected to the devices 200, as shown in FIG. 3B.

Figure 3C:
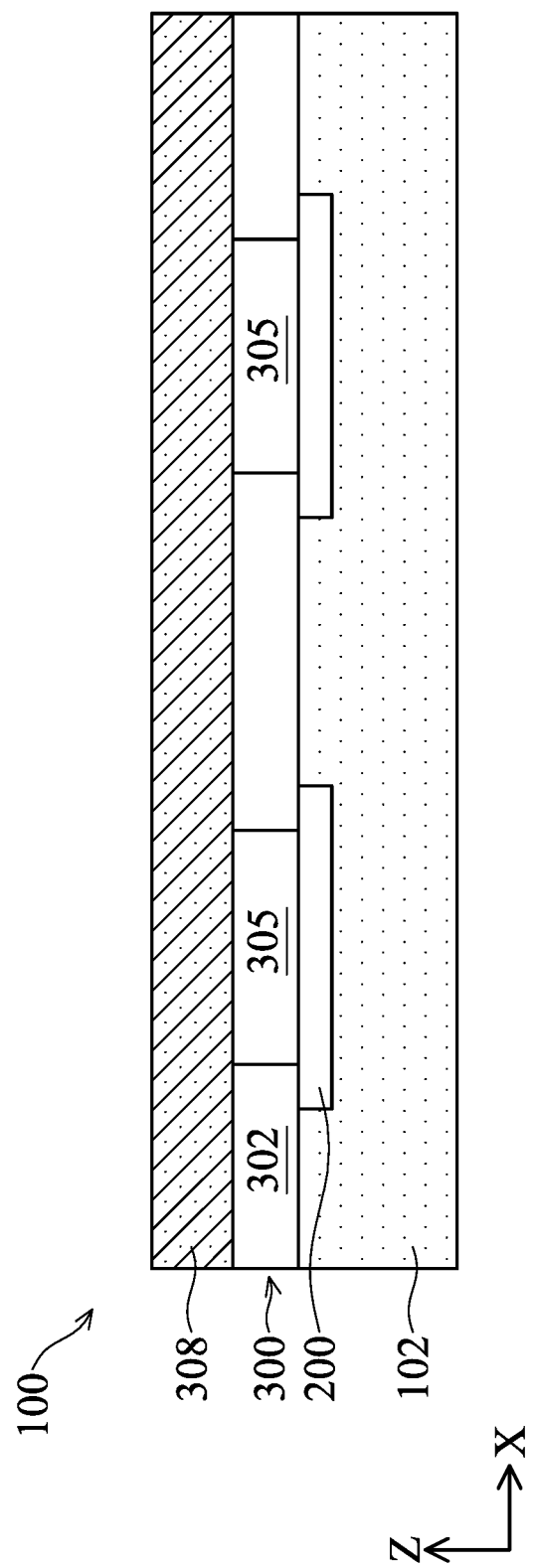
Figure 3D:
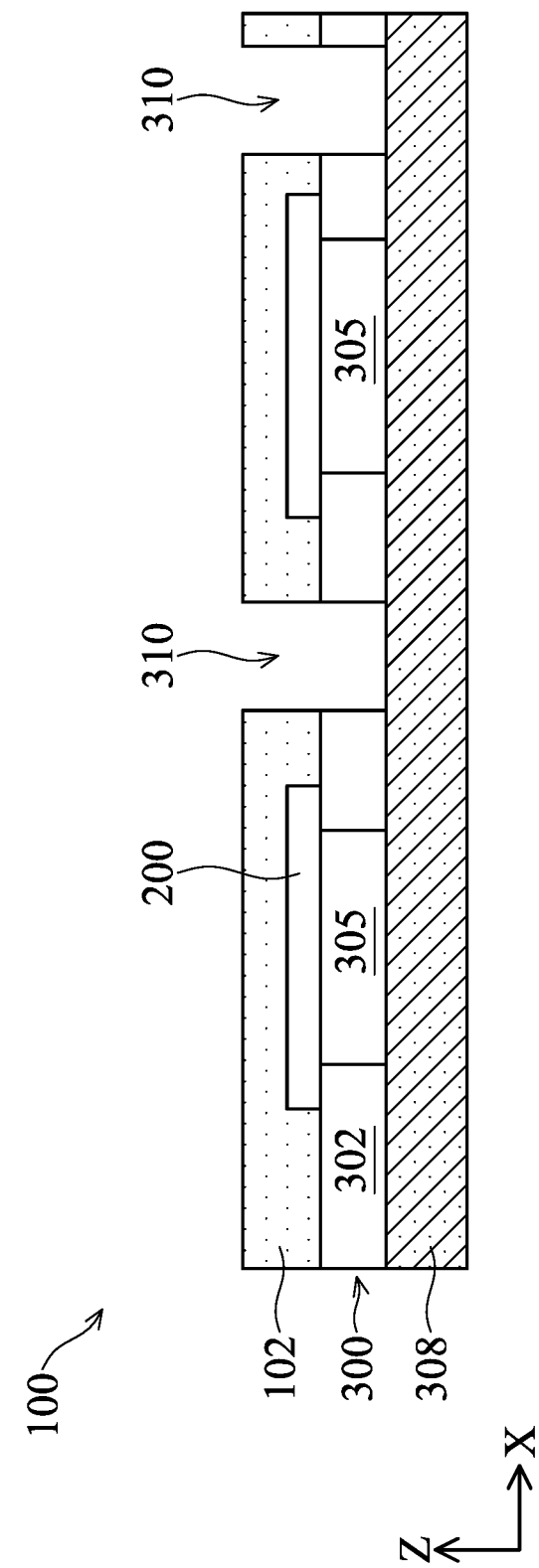

As shown in FIG. 3C, a carrier layer 308 is formed on the interconnection structure 300. The carrier layer 308 may include epoxy resin and may be formed by spin coating or tape casting. The semiconductor device structure 100 may be flipped over, and the substrate 102 may be thinned by any suitable process, as shown in FIG. 3D. In some embodiments, the thinning of the substrate 102 may be performed by a planarization process, such as a chemical mechanical polishing (CMP) process. The remaining substrate 102 after the thinning process may have a thickness ranging from about 80 microns to about 150 microns.

Openings 310 are formed in the thinned substrate 102 and the interconnection structure 300, as shown in FIG. 3D. The openings 310 may have any suitable shape. In some embodiments, the opening 310 has a substantially circular cross-sectional shape in the x-y plane and a diameter ranging from about 10 microns to about 50 microns. The depth of the opening 310 in the z direction may range from about 200 microns to about 300 microns. In some embodiments, the openings 310 include straight sidewalls, as shown in FIG. 3D. In some embodiments, the sidewalls of the openings 310 may be tapered. In other words, the sidewalls of the openings 310 may form an angle with respect to the exposed surface of the carrier layer 308, and the angle may range from about 90 degrees to about 120 degrees. The openings 310 may be formed between adjacent devices 200 and between adjacent conductive features 305, as shown in FIG. 3D. Thus, materials formed in the openings 310 are not in contact with the devices 200 and are electrically insulated from the devices 200. Similarly, materials formed in the openings 310 are not in contact with the conductive features 305 and are electrically insulated from the conductive features 305. The openings 310 are formed in the substrate 102 and the interconnection structure 300, and portions of the carrier layer 308 are exposed.

In some embodiments, the openings 310 are via openings formed by one or more etching processes, such as a plasma deep reactive ion etching (DRIE) process with chlorine-containing gas and/or fluorine-containing gas as an etchant. For example, the plasma DRIE process may use inductively coupled plasma (ICP) having a power ranging from about 100 W to about 1500 W, a bias voltage ranging from about 0 V to about 300 V, and organic etchant such as $CH_3COOH$, $CH_3OH$, $CH_3CH_2OH$, or combinations thereof. In another example, the ICP plasma DRIE process may have a power ranging from about 100 W to about 1500 W, a bias voltage ranging from about 0 V to about 500 V, and etchant such as $CF_4$, $CHF_3$, $CH_3F$, $CH_2F_2$, $C_4F_8$, $C_4F_6$, $N_2$, $O_2$, Ar, or combinations thereof. In yet another example, the plasma DRIE process may have a power ranging from about 100 W to about 2000 W, a bias voltage ranging from about 0 V to about 500 V, and etchant such as $Cl_2$, $SiCl_4$, $BCl_3$, $CF_4$, $CHF_3$, $CH_2F_2$, $C_4F_8$, $C_4F_6$, $N_2$, $O_2$, Ar, or combinations thereof. In some embodiments, the openings 310 are formed by laser drilling.

Figure 3E:
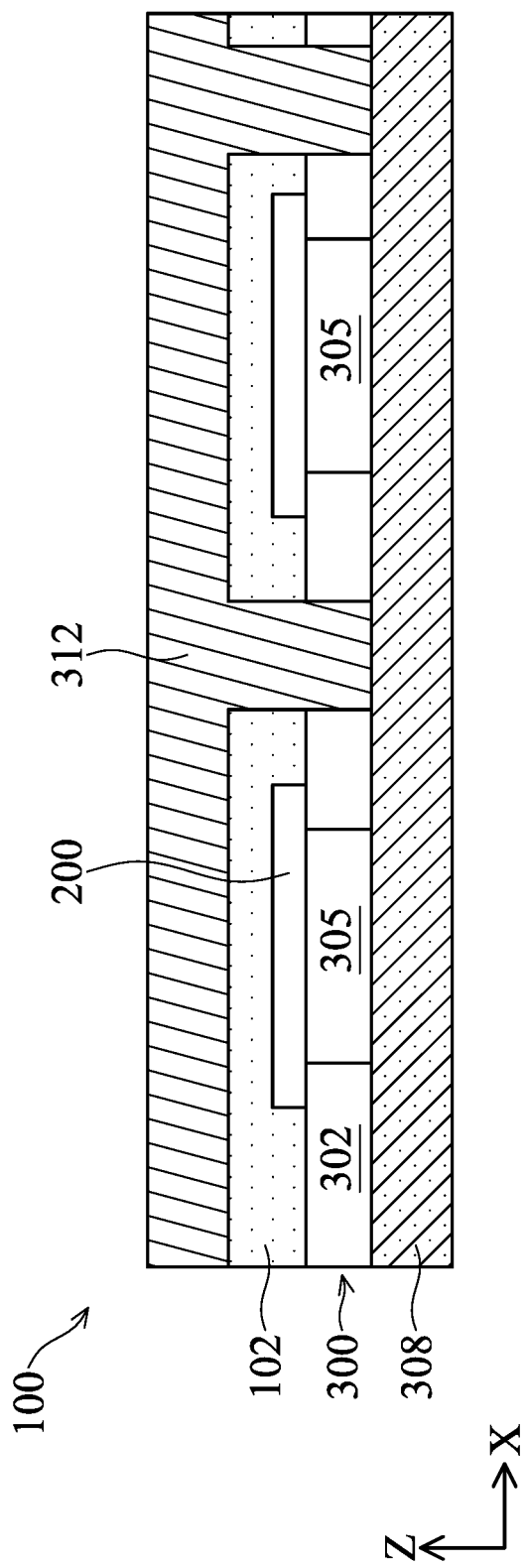

As shown in FIG. 3E, a thermal conductive layer 312 is formed in each opening 310 and on the substrate 102. The thermal conductive layer 312 may be formed by any suitable process, such as CVD, ALD, or PVD. The thermal conductive layer 312 has a thermal conductivity greater than a thermal conductivity of the substrate 102. For example, in some embodiments, the substrate 102 is a silicon substrate and has a thermal conductivity of about 150 W/(m*K), and the thermal conductive layer 312 includes a two-dimensional (2D) material, such as graphene, and has a thermal conductivity ranging from about 3000 W/(m*K) to about 5000 W/(m*K). The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, $Te_e$, $WS_2$, $MoS_2$, $WSe_2$, $MoSe_2$, or any combination thereof. The thermal conductive layer 312 includes a material having a thermal conductivity greater than about 150 W/(m*K). In some embodiments, the thermal conductive layer includes a 2D material, aluminum nitride (AlN), diamond-like carbon (DLC), a metal, or any suitable thermally conductive material. AlN may have a thermal conductivity of about 285 W/(m*K), DLC may have a thermal conductivity of about 1100 W/(m*K), and copper may have a thermal conductivity of about 385 W/(m*K). Thus, in some embodiments, the thermal conductivity of the thermal conductive layer 312 may be greater than about 250 W/(m*K), such as from about 280 W/(m*K) to about 5000 W/(m*K). In some embodiments, the thermal conductivity of the thermal conductive layer 312 may be greater than about 1000 W/(m*K), such as from about 1000 W/(m*K) to about 5000 W/(m*K).

The thermal conductive layer 312 is not physically or electrically connected to any power/signal source, and no substantial electric current or signal is flowed through the thermal conductive layer 312. The portions of the thermal conductive layer 312 disposed between adjacent devices 200 provide a path for dissipating heat generated during operation of the devices 200, and the portion of the thermal conductive layer 312 formed on the substrate 102 may function as a thermal interface material (TIM). The portion of the thermal conductive layer 312 disposed between adjacent devices 200 may be thermal conductive features. In some embodiments, each device 200 is in close proximity to the thermal conductive feature of the thermal conductive layer 312, which has a higher thermal conductivity than the materials of the interconnection structure 300 and the substrate 102. As a result, improved heat dissipation is achieved, which leads to reduced device failure.

Figure 3F:
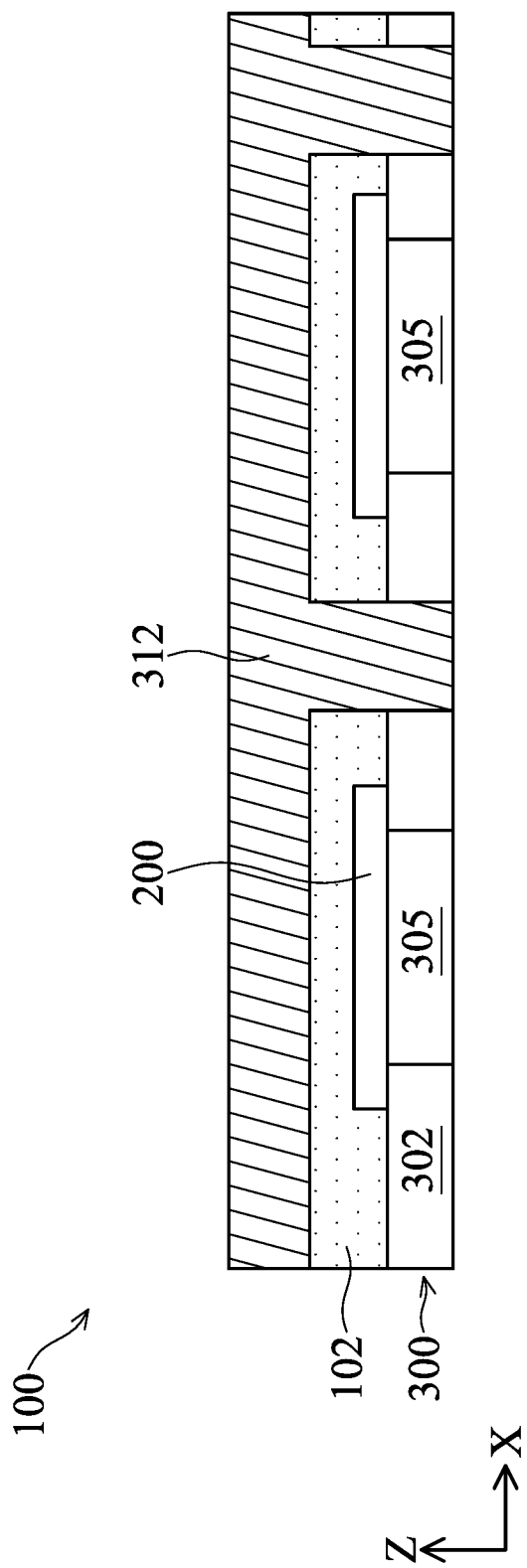

As shown in FIG. 3F, the carrier layer 308 is removed. The removal of the carrier layer 308 may be performed by any suitable process, such as wet etch, dry etch, or planarization. In some embodiments, the carrier layer 308 is removed by a wet clean. For example, the wet clean may utilize one or more solvents, such as tolunitrile, 4-methyl-3-nitrobenzonitrile, 4-(bromomethyl)benzonitrile, 4-(chloromethyl)benzonitrile, 2-fluoro-4-(trifluoromethyl)benzonitrile, 4-(trifluoromethyl)benzonitrile, diethylene glycol monobutyl ether, 2-(2-butoxyethoxy)ethyl acetate, diethylene glycol dimethyl ether, dimethyl sulfoxide, dimethylformamide, poly(ethylene glycol) bis(amine), (2-methylbutyl)amine, tris(2-ethylhexyl)amine, (4-isothiocyanatophenyl)(3-methylphenyl)amine, poly(ethylene glycol) methyl ether amine, poly(ethylene glycol) diamine, triethanolamine hydrochloride, triethanolamine, trolamine, trolamine salicylate, 2-chloroethyl vinyl ether, 2-[4-(dimethylamino)phenyl] ethanol, tetraethylethylenediamine, ammonium acetate, ammonium chloride, ammonium sulfate, ammonium formate, ammonium nitrate, ammonium carbonate, ammonium fluoride, ammonium persulphate, ammonium sulfamate, ammonium phosphate, 1-acetylguanidine, general acid, or other suitable solvent. In some embodiments, the solvent is an organic solvent. As shown in FIG. 3F, the semiconductor device structure 100 includes a first side and second side opposite the first side. The first side includes a portion of the thermal conductive layer 312. The conductive features 305 and the portions of the thermal conductive layer 312 are exposed on the second side. The portions of the thermal conductive layer 312 extends through the substrate 102 and the interconnection structure 300. The semiconductor device structure 100 shown in FIG. 3F may be formed over another semiconductor device structure to form a semiconductor device package, such as a 3DIC.

Figure 4A:
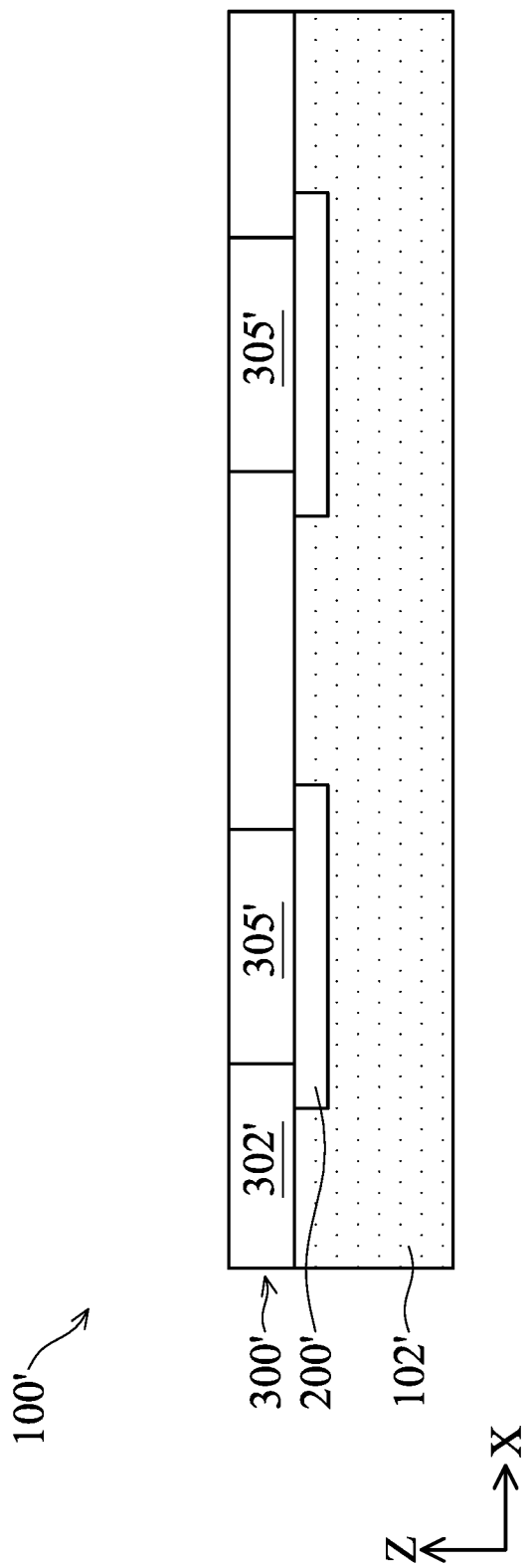
FIGS. 4A-4I are cross-sectional side views of various stages of manufacturing a semiconductor device package, in accordance with some embodiments.

FIGS. 4A-4I are cross-sectional side views of various stages of manufacturing a semiconductor device structure 100' and a semiconductor device package 400, in accordance with some embodiments. As shown in FIG. 4A, the semiconductor device structure 100' includes a substrate 102', one or more devices 200' formed over the substrate 102', and an interconnection structure 300' formed over the substrate 102' and the devices 200'. The substrate 102' may be the same as or different from the substrate 102, the devices 200' may be the same as or different from the devices 200, and the interconnection structure 300' may be the same as or different from the interconnection structure 300. In some embodiments, the devices 200' are logic devices, memory devices, or CMOS. The interconnection structure 300' includes an IMD layer 302' and conductive features 305' formed in the IMD layer 302'. The IMD layer 302' may be the same as or different from the IMD layer 302, and the conductive features 305' may be the same as or different from the conductive features 305.

Figure 4B:
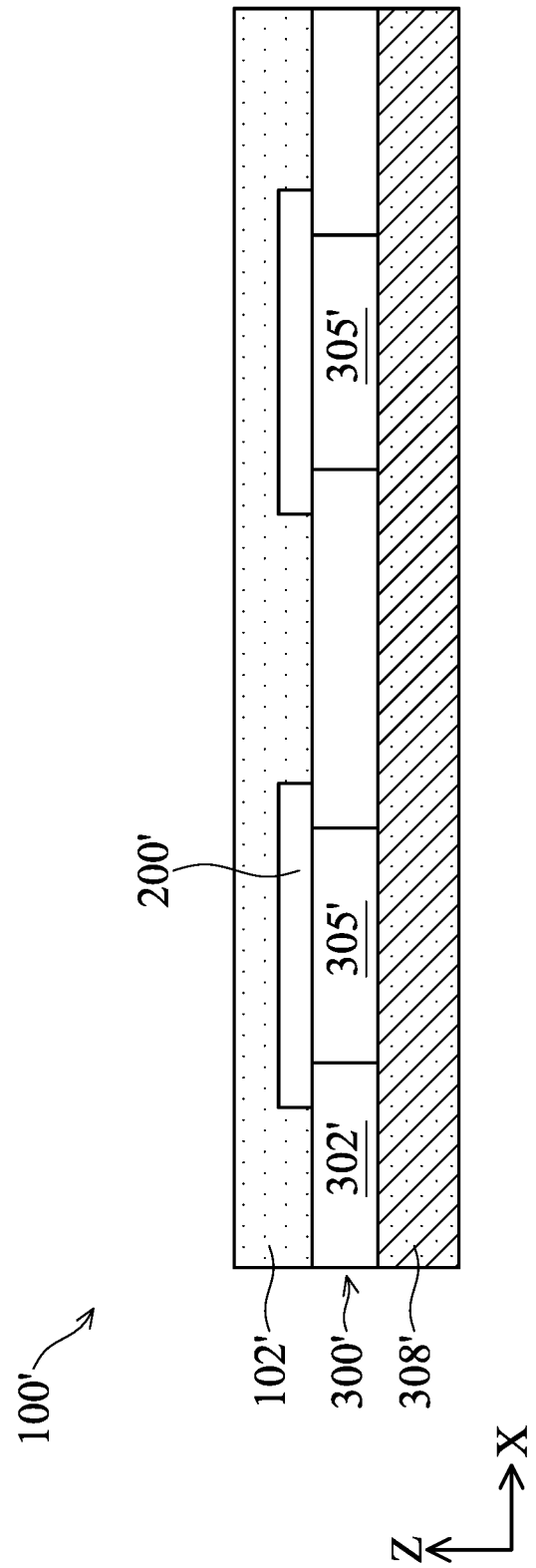

As shown in FIG. 4B, a carrier layer 308' is formed on the interconnection structure 300', and the semiconductor device structure 100' is flipped over. The carrier layer 308' may be the same as the carrier layer 308. Next, the substrate 102' is thinned by any suitable process, such as a CMP process. The remaining substrate 102 may have a thickness ranging from about 80 microns to about 150 microns.

Figure 4C:
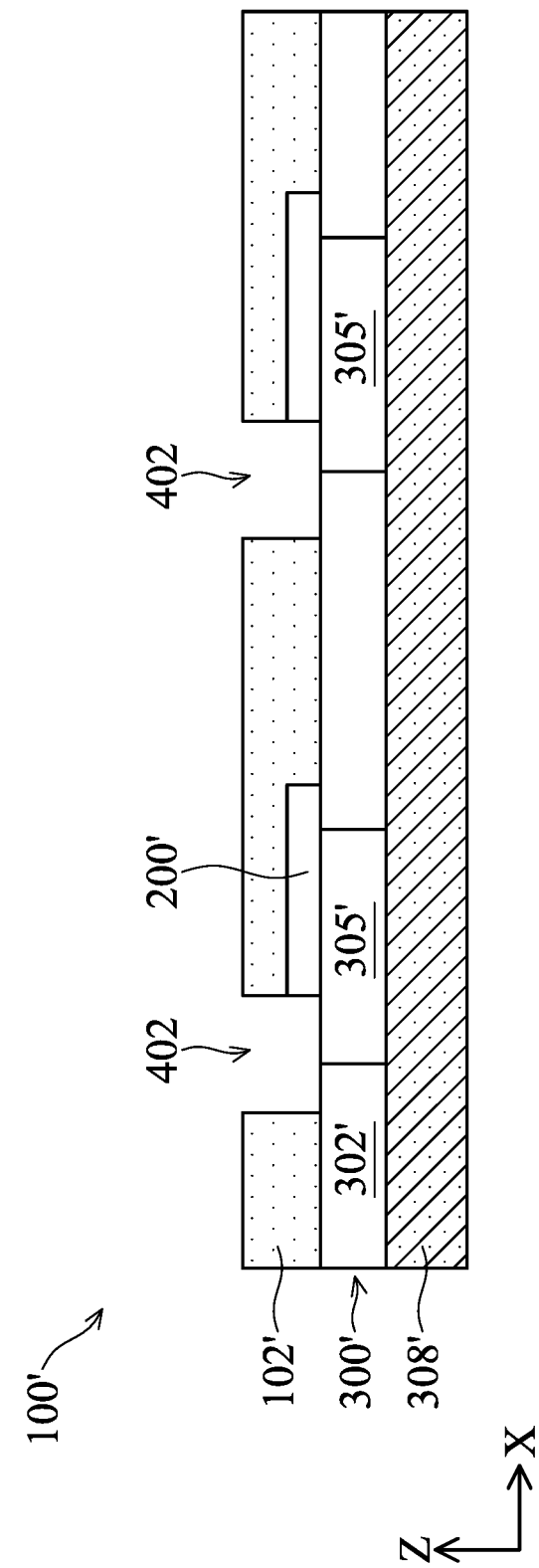

As shown in FIG. 4C, openings 402 are formed in the substrate 102' to expose the devices 200'. The openings 402 may be formed in the remaining substrate 102. In some embodiments, a portion of a device of the devices 200' may be removed. For example, the opening 402 may be formed in a source or drain, such as extending through the source or drain and the conductive contact to expose a portion of the conductive feature 305'. In some embodiments, the openings 402 are formed without removing portions of the devices 200'. In some embodiments, the conductive features 305' may be also exposed. The openings 402 may be formed by the same process as the process used to form the openings 310. In some embodiments, the openings 402 are formed by a plasma DRIE etch process or laser drilling.

Figure 4D:
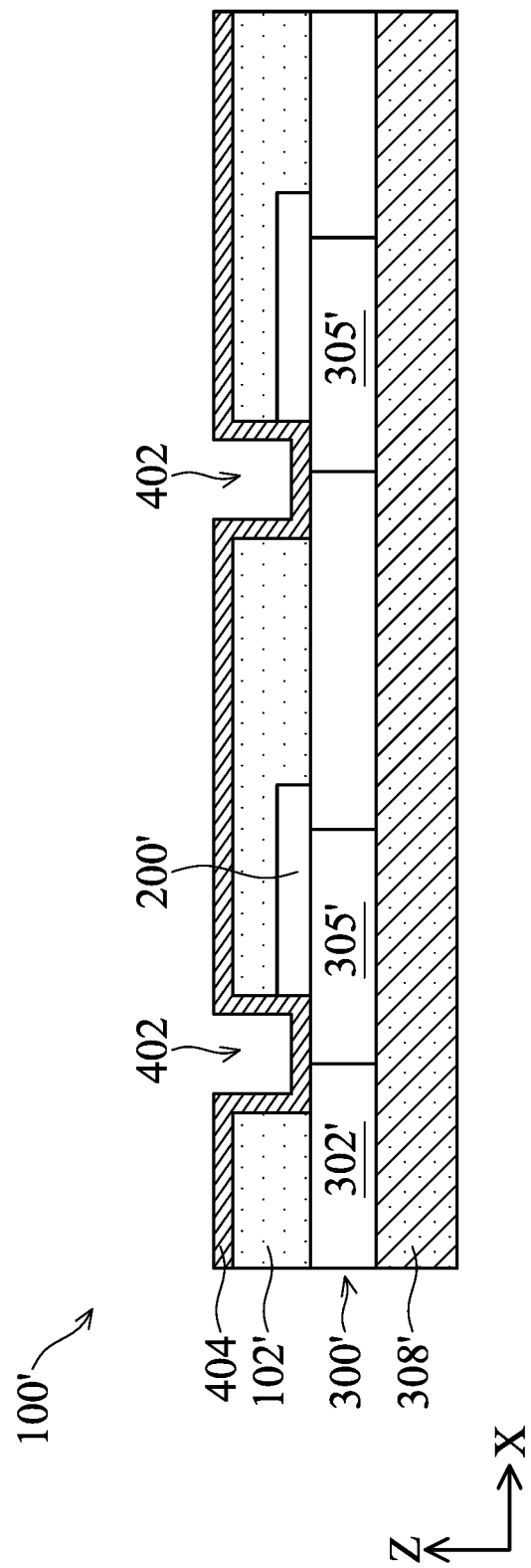

As shown in FIG. 4D, a liner 404 is formed on the substrate 102' and in the openings 402. The liner 404 may include an oxide such as $SiO_x$ or a nitride such as $SiN_x$, and may be formed by CVD, ALD, PVD, or other suitable process. In some embodiments, the liner 404 is a conformal layer and has a thickness ranging from about 100 nm to about 300 nm.

Figure 4E:
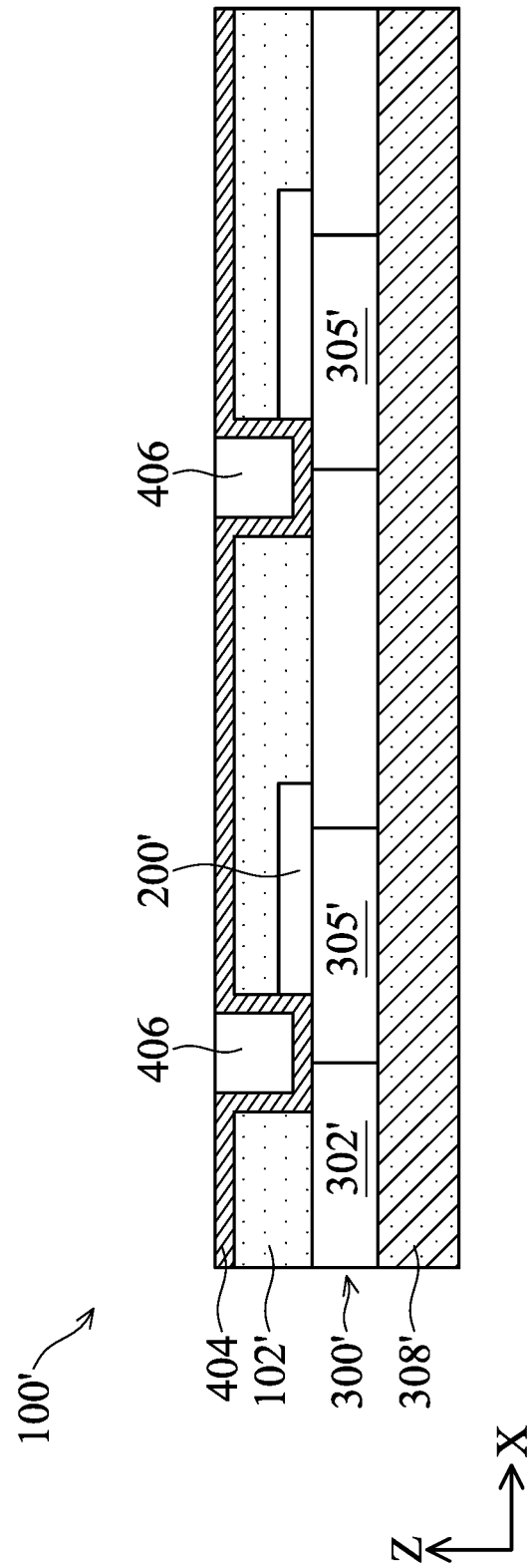

As shown in FIG. 4E, conductive features 406 are formed in the openings 402 to fill the openings 402. The conductive features 406 are formed on the liner 404 in the openings 402.

In some embodiments, the conductive features 406 may be any suitable electrically conductive material, such as a metal, for example Cu, W, Ru, Mo, or other suitable metal. In some embodiments, the conductive features 406 include doped polysilicon. The conductive features 406 are in electrical contact with the devices 200. The conductive feature 406 may be formed by any suitable process, such as electrochemical plating (ECP), electroless deposition (ELD), PVD, or ALD. In some embodiments, the conductive features 406 may be formed by first forming a conductive material in the openings 402 and over the substrate 102', and then removing the portion of the conductive material formed over the substrate 102'. The removal of the portion of the conductive material formed over the substrate 102' may be performed by any suitable process, such as a CMP process. In some embodiments, at the end of the CMP process, the liner 404 and the conductive features 406 are exposed, as shown in FIG. 4E. In some embodiments, the portion of the liner 404 disposed on the substrate 102' is also removed by the CMP process, and the substrate 102' and the conductive features 406 are exposed.

Figure 4F:
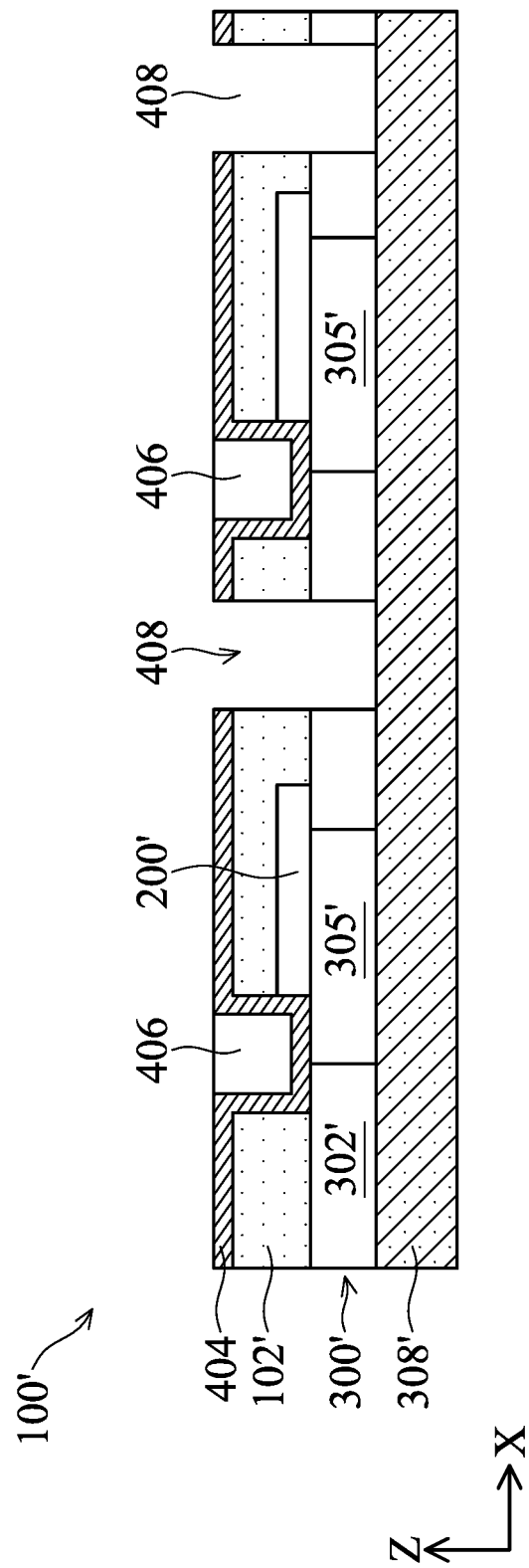

As shown in FIG. 4F, openings 408 are formed in the liner 404, the substrate 102' and the interconnection structure 300'. The openings 408 may be formed by the same processes as the processes for forming the openings 310. The openings 408 may have the same dimensions as the openings 310. In some embodiments, the openings 408 may be about 100 nm to about 300 nm deeper than the openings 310 because of the liner 404. The openings 408 exposes portions of the carrier layer 308'. In some embodiments, the openings 408 include straight sidewalls, as shown in FIG. 4F. In some embodiments, the sidewalls of the openings 408 may be tapered. In other words, the sidewalls of the openings 408 may form an angle with respect to the exposed surface of the carrier layer 308', and the angle may range from about 90 degrees to about 120 degrees. Similar to the openings 310, the openings 408 are formed between adjacent devices 200' and between adjacent conductive features 305', as shown in FIG. 4F. Thus, materials formed in the openings 408 are not in contact with the devices 200' and are electrically insulated from the devices 200'. Similarly, materials formed in the openings 408 are not in contact with the conductive features 305' and are electrically insulated from the conductive features 305'.

Figure 4G:
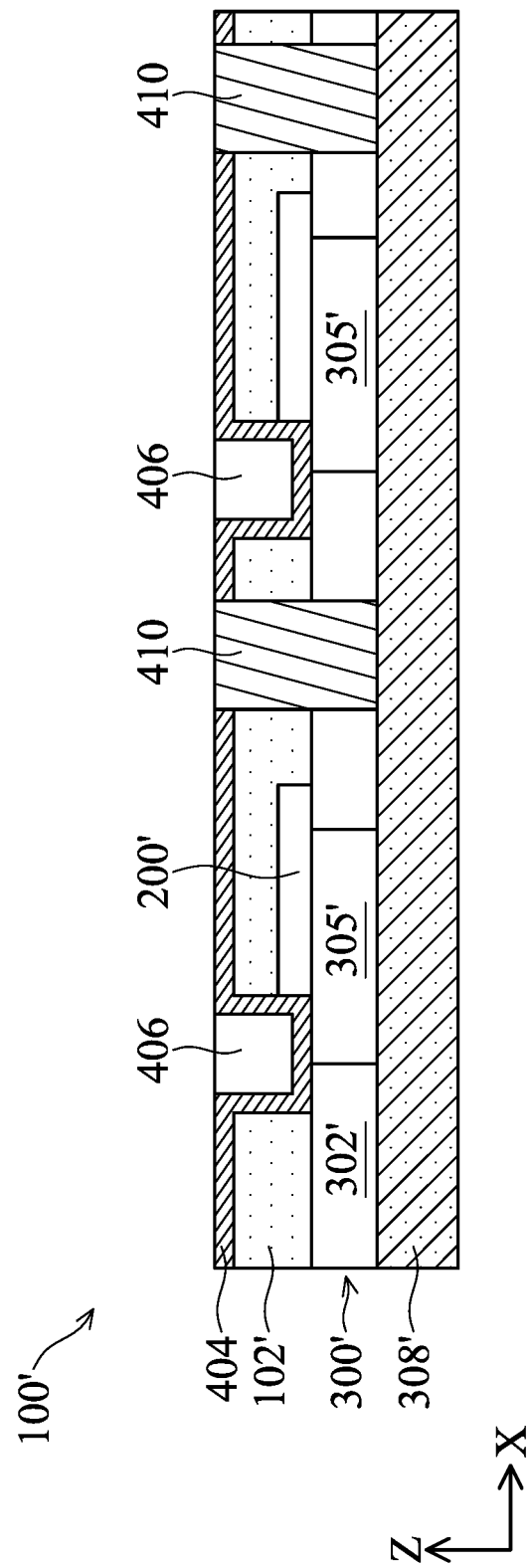

As shown in FIG. 4G, thermal conductive features 410 are formed in the openings 408 to fill the openings 408. The thermal conductive features 410 may include the same material as the thermal conductive layer 312 and may be formed by the same process as the thermal conductive layer 312. In some embodiments, the thermal conductive features 410 may be formed by first forming a thermal conductive material in the openings 408 and over the substrate 102', and then removing the portion of the thermal conductive material formed over the substrate 102'. The removal of the portion of the thermal conductive material formed over the substrate 102' may be performed by any suitable process, such as a CMP process. In some embodiments, at the end of the CMP process, the liner 404, the conductive features 406, and the thermal conductive features 410 are exposed, as shown in FIG. 4G. In some embodiments, the portion of the liner 404 disposed on the substrate 102' is also removed by the CMP process, and the substrate 102', the thermal conductive features 410, and the conductive features 406 are exposed.

Similar to the thermal conductive layer 312, the thermal conductive features 410 are not physically or electrically connected to any power/signal source, and no substantial electric current or signal is flowed through the thermal conductive features 410. The thermal conductive feature 410 disposed between adjacent devices 200' provides a path for dissipating heat generated during operation of the devices 200'. In some embodiments, each device 200' is in close proximity to the thermal conductive feature 410, which has a higher thermal conductivity than the materials of the interconnection structure 300' and the substrate 102'. As a result, improved heat dissipation is achieved, which leads to reduced device failure.

Figure 4H:
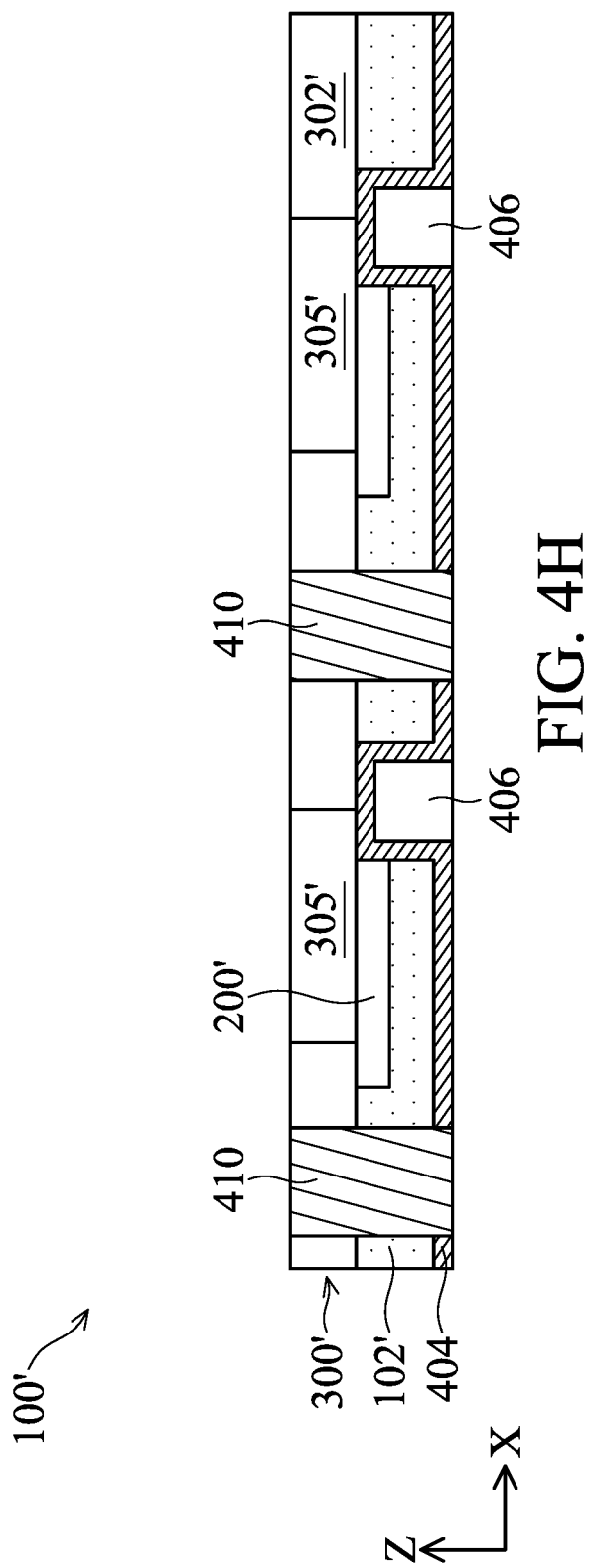

As shown in FIG. 4H, the carrier layer 308' is removed. The removal of the carrier layer 308' may be performed by any suitable process. In some embodiments, the carrier layer 308' is removed by the same process as for the carrier layer 308. The resulting structure includes a semiconductor device structure 100' having a first side and a second side opposite the first side. The thermal conductive features 410 extends from the first side to the second side and are exposed on the first side and the second side. The conductive features 305' are exposed on the first side, and the conductive features 406 are exposed on the second side. The conductive features 305' may be electrically connected to corresponding conductive features 406.

Figure 4I:
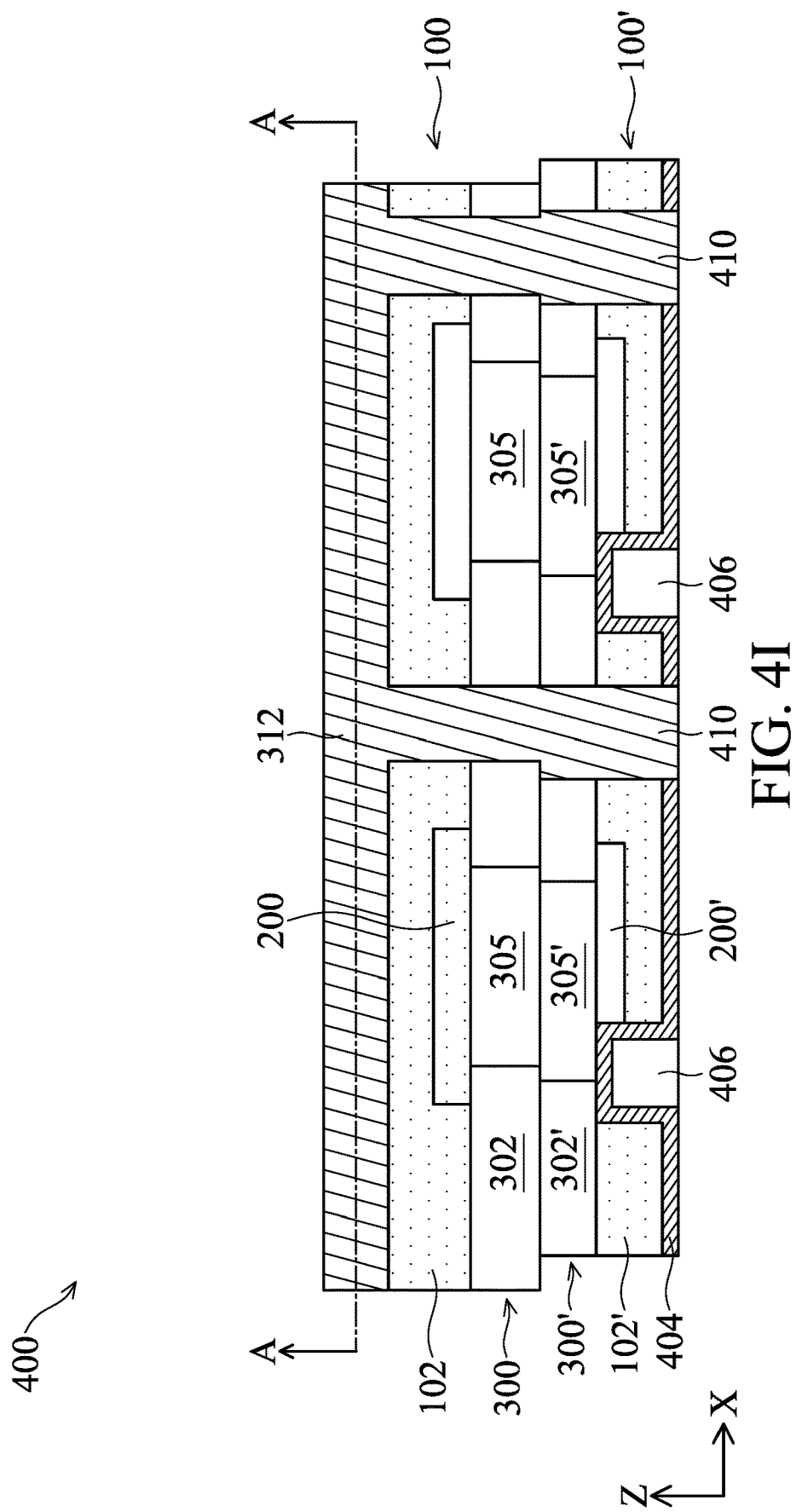

As shown in FIG. 4I, the semiconductor device structure 100 shown in FIG. 3F is bonded to the semiconductor device structure 100' to form one or more semiconductor device packages 400. In some embodiments, the semiconductor device package 400 is a 3DIC. In some embodiments, the substrate 102 and the substrate 102' may be wafers, such as 200 mm, 300 mm, 450 mm, or other suitable sized wafers. Devices 200 and 200' are formed on the substrates 102, 102', respectively, and interconnection structures 300, 300' are formed over the substrates 102, 102', respectively. Thus, the structure shown in FIG. 4I may include a plurality of semiconductor device packages 400, such as 3DICs. As shown in FIG. 4I, the conductive features 305 are substantially aligned with the conductive features 305', and the portions of the thermal conductive layer 312 exposed on the second side of the semiconductor device structure 100 are substantially aligned with corresponding thermal conductive features 410. In some embodiments, the alignment may be slightly off, but at least a portion of the portion of the thermal conductive layer 312 is in contact with a portion of the corresponding thermal conductive feature 410. Similarly, at least a portion of the conductive feature 305 is in contact with a portion of the corresponding conductive feature 305'.

The semiconductor device structure 100 may be bonded to the semiconductor device structure 100' by any suitable process. In some embodiments, hybrid bonding is used to bond the semiconductor device structures 100, 100'. For example, the semiconductor device structures 100, 100' may be annealed in nitrogen gas environment to a temperature ranging from about 200 degrees Celsius to about 400 degrees Celsius to reflow the materials of the conductive features 305, 305' and the materials of the thermal conductive layer 312 and the thermal conductive features 410. As a result, void-less bonding is formed between the semiconductor device structure 100 and the semiconductor device structure 100'.

The one or more semiconductor device packages 400 shown in FIG. 4I include separate electrical routing and thermal routing. For example, the conductive features 406 may be through silicon via (TSV) that provide electrical connection between the semiconductor device structure 100 and the semiconductor device structure 100'. The portions of the thermal conductive layer 312 extending through the substrate 102 and the interconnection structure 300 and the thermal conductive features 410 may be through silicon thermal via (TSTV) that provide heat dissipation. The conductive features 406 are electrically connected to a power/signal source and the devices 200, 200'. The thermal conductive layer 312 and the thermal conductive features 410 are electrically isolated from the devices 200, 200'. The material of the thermal conductive layer 312 and the thermal conductive features 410 may have high elastic modulus which can improve the strength of the 3DIC 400. For example, in some embodiments, the thermal conductive layer 312 includes AlN, which has a Young's modulus ranging from about 300 GPa to about 350 GPa. Furthermore, no liners for electrical isolation are formed around the thermal conductive layer 312 and the thermal conductive features 410. As a result, heat dissipation by the thermal conductive layer 312 and the thermal conductive features 410 are improved.

Figure 5:
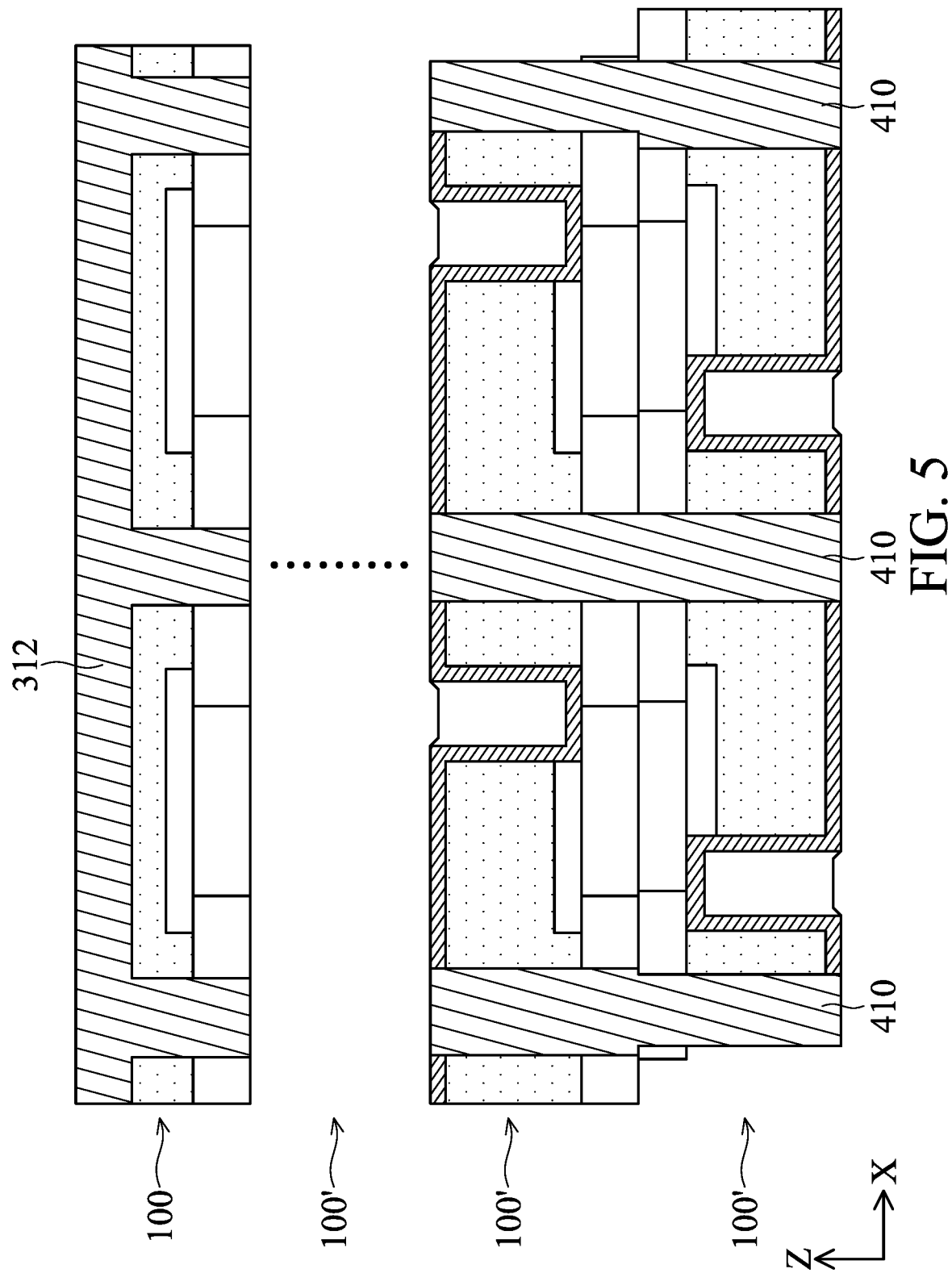
FIG. 5 is a cross-sectional side view of a stage of manufacturing a semiconductor device package, in accordance with some embodiments.

In some embodiments, additional semiconductor device structures 100' may be disposed between the semiconductor device structure 100' and the semiconductor device structure 100. For example, as shown in FIG. 5, multiple semiconductor device structures 100' are stacked on top of each other, and the semiconductor device structure 100 is formed on the stack of semiconductor device structures 100'. The bottom of the bottom-most semiconductor device structure 100' may be covered by a polymer (not shown) with conductive features (not shown), such as conductive bumps, formed in the polymer in contact with the conductive features 406. The conductive bumps may be electrically connected to a power source to provide power to the semiconductor device structures 100', 100. Without the thermal conductive features 410, it is difficult to dissipate heat generated by the devices 200' in the bottom-most semiconductor device structure 100' and in the stack of semiconductor device structures 100'. With the thermal conductive features 410 formed in each semiconductor device structure 100', heat generated may be dissipated from the stack of semiconductor device structures 100' to the semiconductor device structure 100.

Figure 6:
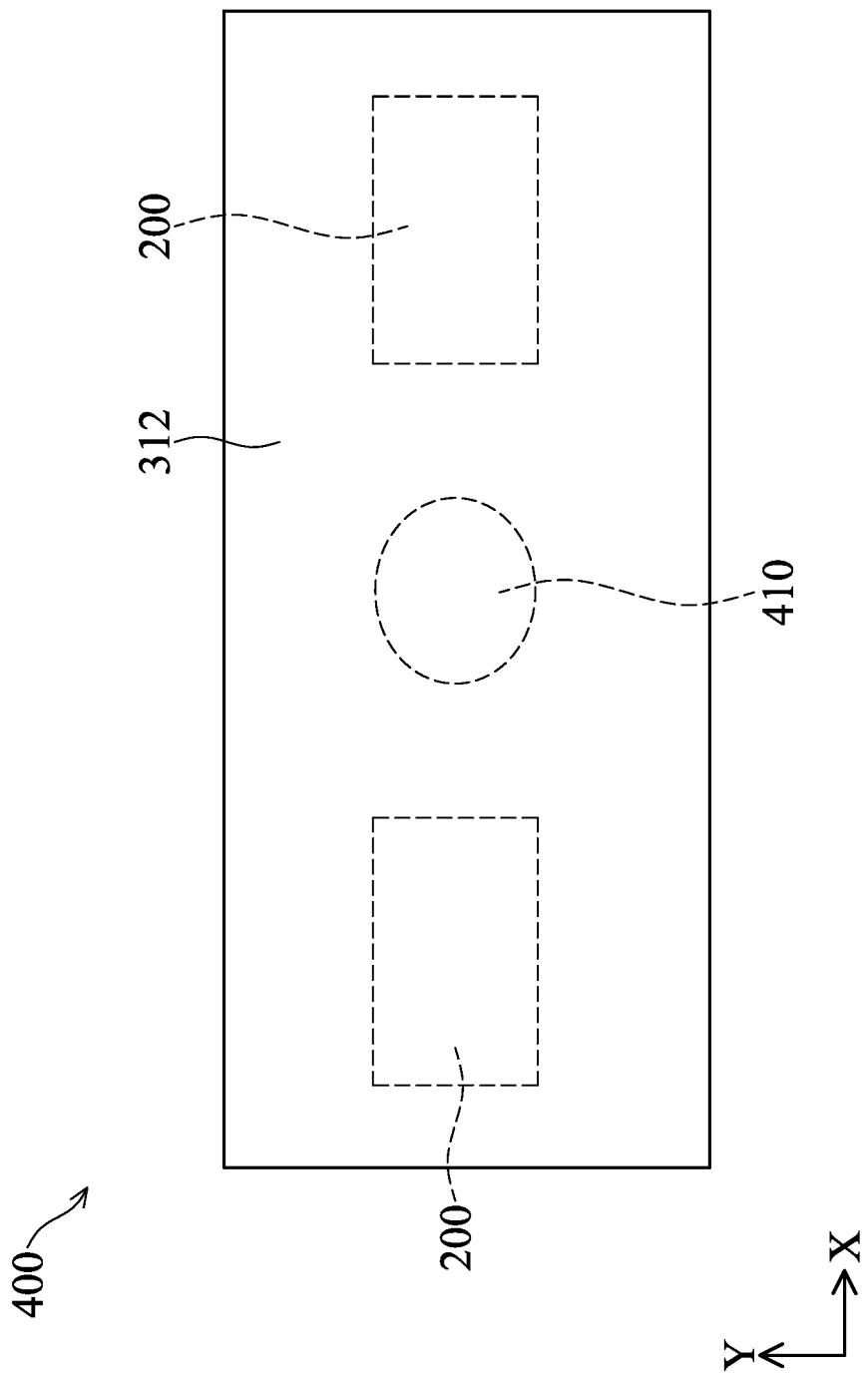
FIG. 6 is a cross-sectional top view of the semiconductor device package taken along cross-section A-A of FIG. 4I, in accordance with some embodiments.

FIG. 6 is a cross-sectional top view of the semiconductor device package 400 taken along cross-section A-A of FIG. 4I, in accordance with some embodiments. As shown in FIG. 6, the thermal conductive layer 312 is disposed over the thermal conductive features 410 and the devices 200. The thermal conductive layer 312 may cover the entire top of the semiconductor device package 400. When forming the semiconductor device structure 100, the thermal conductive layer 312 may cover the entire back side of the substrate 102. In some embodiments, the substrate 102 is a semiconductor wafer, and the thermal conductive layer 312 covers the entire back side of the semiconductor wafer.

Figure 7:
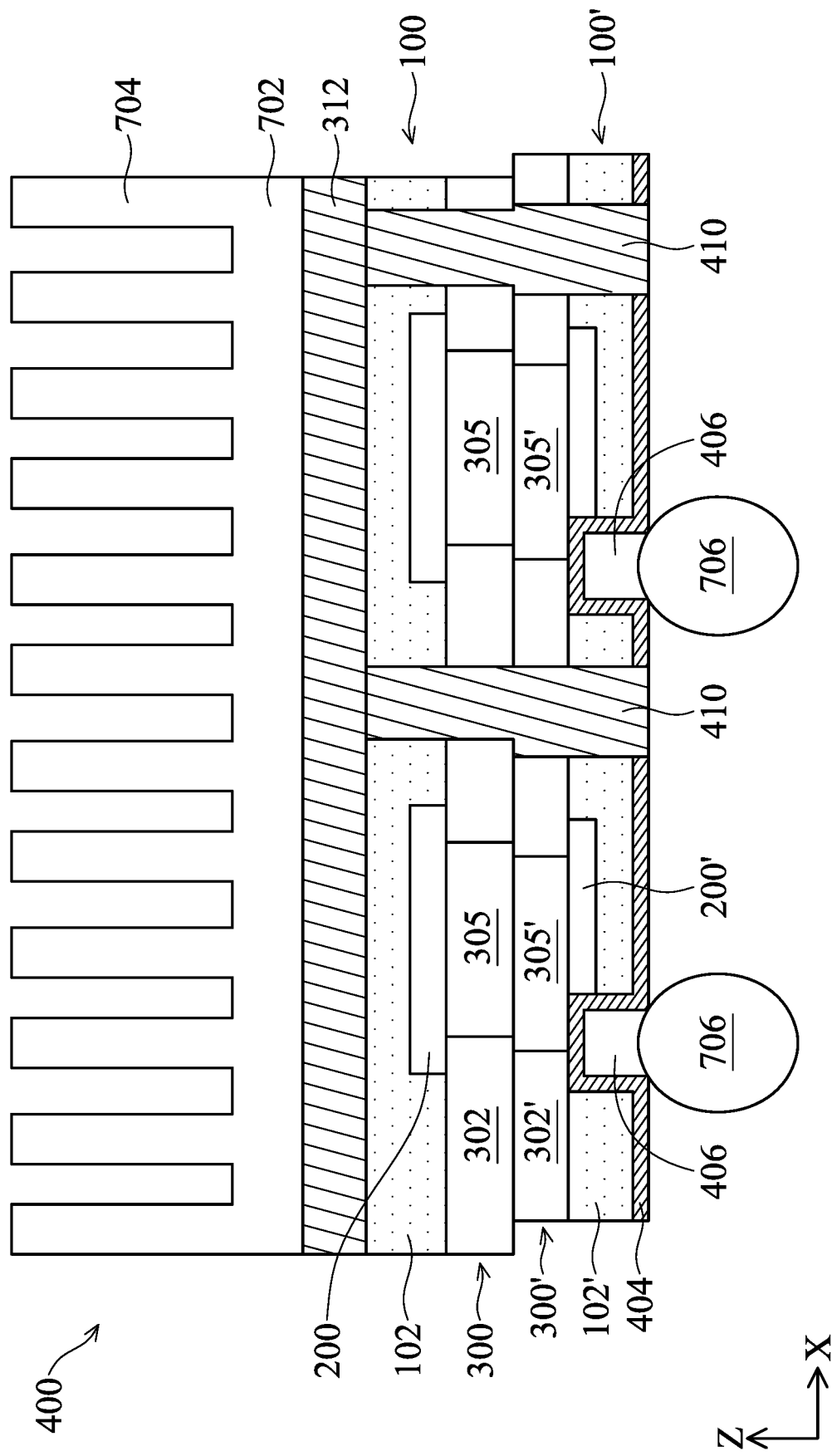
FIG. 7 is a cross-sectional side view of a stage manufacturing the semiconductor device package of FIG. 4I, in accordance with some embodiments.

FIG. 7 is a cross-sectional side view of a stage manufacturing the semiconductor device package 400 of FIG. 4I, in accordance with some embodiments. In some embodiments, the semiconductor device package 400 is a single die that has been diced from a semiconductor wafer. The semiconductor device package 400 may further include a heat sink 702 disposed over the thermal conductive layer 312. The heat sink 702 may includes a plurality of fins 704 for further heat dissipation. The heat sink 702 may include a material having high thermal conductivity. In some embodiments, the heat sink 702 includes aluminum. A glue layer (not shown) may be disposed between the thermal conductive layer 312 and the heat sink 702. The semiconductor device package 400 also includes conductive bumps 706 electrically connected to the conductive feature 406. The conductive bumps 706 may be configured to be electrically connected to a printed circuit board (PCB). The gap between the semiconductor device package 400 and the PCB may be filled with a dielectric material. Thus, heat generated in the semiconductor device package 400 during operation is dissipated by the thermal conductive features 410, the thermal conductive layer 312, and the heat sink 702.

The present disclosure in various embodiments provides thermal features in a semiconductor device package and the method of making the semiconductor device package. In some embodiments, a semiconductor device package 400 includes a first semiconductor device structure 100' and a second semiconductor device structure 100 formed on the first semiconductor device structure 100'. Thermal conductive features 410 are formed in the first semiconductor device structure 100' between adjacent devices 200', and portions of a thermal conductive layer 312 are formed in the second semiconductor device structure 100 between adjacent devices 200. The thermal conductive features 410 may be substantially aligned with corresponding portions of the thermal conductive layer 312. Some embodiments may achieve advantages. For example, the thermal management capability for semiconductor device packages may be improved because the material of the thermal conductive layer 312 and the thermal conductive features 410 has a greater thermal conductivity compared to the materials of the first and second semiconductor device structures 100', 100. Furthermore, the thermal conductive layer 312 and the thermal conductive features 410 are not used for electrical routing, thus, do not generate heat. As a result, improved heat dissipation may be achieved.

An embodiment is a semiconductor device package. The semiconductor device package includes a first semiconductor device structure having a first substrate, two first devices disposed on the first substrate, a first interconnection structure disposed over the first substrate and the two first devices, and a first thermal conductive feature disposed through the first substrate and the first interconnection structure. The first conductive thermal feature is disposed between the two first devices and is electrically isolated from the two first devices. The semiconductor device package further includes a second semiconductor device structure disposed over the first semiconductor device structure having a second interconnection structure disposed over the first interconnection structure, a second substrate disposed over the second interconnection structure, two second devices disposed between the second substrate and the second interconnection structure, and a second thermal conductive feature disposed through the second substrate and the second interconnection structure. The second thermal conductive feature is disposed between the two second devices and is electrically isolated from the two second devices. The second thermal conductive feature is in contact with the first thermal conductive feature.

Another embodiment is a semiconductor device package. The semiconductor device package includes a plurality of semiconductor device structures, each of the plurality of semiconductor device structures having a first substrate, a plurality of devices disposed on the first substrate, a first interconnection structure disposed over the first substrate and the plurality of devices; and a plurality of thermal conductive features extending through the first substrate and the first interconnection structure. Each of the plurality of thermal conductive features is disposed between adjacent devices of the plurality of devices and is electrically isolated from the plurality of devices. The semiconductor device package further includes a semiconductor device structure disposed over the plurality of semiconductor device structures having a second interconnection structure disposed over the plurality of semiconductor device structures, a second substrate disposed over the second interconnection structure; and a thermal conductive layer. A first portion of the thermal conductive layer is disposed on the second substrate, and second portions of the thermal conductive layer are disposed through the second substrate and the second interconnection structure. the pluralities of thermal conductive features in the plurality of semiconductor device structures are substantially aligned, and the second portions of the thermal conductive layer are substantially aligned with corresponding pluralities of thermal conductive features.

A further embodiment is a method. The method includes forming a first semiconductor device structure. Forming the first semiconductor device structure includes forming two or more first devices on a first substrate, forming a first interconnection structure over the first substrate and the two or more devices, forming first openings in the first substrate and the first interconnection structure between adjacent devices of the two or more first devices, and forming a thermal conductive layer in the first openings and on the first substrate. The thermal conductive layer is electrically isolated from the two or more first devices. The method further includes forming a second semiconductor device structure. Forming the second semiconductor device structure includes forming two or more second devices on a second substrate, forming a second interconnection structure over the second substrate and the two or more second devices, forming second openings in the second substrate and the second interconnection structure between adjacent devices of the two or more second devices, and forming thermal conductive features in the second openings. The thermal conductive features are electrically isolated from the two or more second devices. The method further includes bonding the first semiconductor device structure to the second semiconductor device structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
  forming a first semiconductor device structure, comprising:
    forming two or more first devices on a first substrate;
    forming a first interconnection structure over the first substrate and the two or more devices;
    forming first openings in the first substrate and the first interconnection structure between adjacent devices of the two or more first devices; and
    forming a thermal conductive layer in the first openings and on the first substrate, wherein the thermal conductive layer is formed by a single deposition process and is electrically isolated from the two or more first devices, and the thermal conductive layer covers an entire back side of the first substrate;
  forming a second semiconductor device structure, comprising:
    forming two or more second devices on a second substrate;
    forming a second interconnection structure over the second substrate and the two or more second devices;
    forming second openings in the second substrate and the second interconnection structure between adjacent devices of the two or more second devices; and
    forming thermal conductive features in the second openings, wherein the thermal conductive features are electrically isolated from the two or more second devices; and
  bonding the first semiconductor device structure to the second semiconductor device structure.

2. The method of claim 1, further comprising forming third openings in the second substrate before bonding the first semiconductor device structure to the second semiconductor device structure.

3. The method of claim 2, further comprising forming conductive features in the third openings before bonding the first semiconductor device structure to the second semiconductor device structure, wherein the conductive features are electrically connected to the two or more second devices.

4. The method of claim 3, further comprising forming a first carrier layer on the first interconnection structure before forming the first openings.

5. The method of claim 4, further comprising removing the first carrier layer after forming the thermal conductive layer.

6. The method of claim 5, further comprising forming a second carrier layer on the second interconnection structure before forming the third openings.

7. A method, comprising:
  forming a first device and a second device on a first substrate;
  forming a first interconnection structure over the first substrate and the first and second devices;
  forming a carrier layer on the first interconnection structure;
  flipping over the first substrate;
  forming a first opening in the first interconnection structure and in the first substrate between the first and second devices;
  forming a first thermal conductive layer in the first opening and on the first substrate, wherein the first thermal conductive layer comprises a two-dimensional material, aluminum nitride, diamond-like carbon, or a metal, and the thermal conductive layer covers an entire back side of the first substrate;
  removing the carrier layer to expose a portion of the first thermal conductive layer and the interconnection structure.

8. The method of claim 7, further comprising:
  forming a third device and a fourth device on a second substrate;
  forming a second interconnect structure over the second substrate and the third and fourth devices;
  flipping over the second substrate;
  forming a second opening in the second interconnection structure and in the second substrate between the third and fourth devices; and
  forming a second thermal conductive layer in the second opening and on the second substrate.

9. The method of claim 8, further comprising removing a portion of the second thermal conductive layer formed on the second substrate.

10. The method of claim 9, further comprising bonding the first interconnection structure to the second interconnection structure, wherein the first thermal conductive layer is in contact with the second thermal conductive layer.

11. The method of claim 8, further comprising forming a third opening and a fourth opening in the second substrate prior to forming the second opening.

12. The method of claim 11, further comprising forming a first conductive feature in the third opening and forming a second conductive feature in the fourth opening, wherein the first conductive feature is in electrical contact with the third device, and the second conductive feature is in electrical contact with the fourth device.

13. The method of claim 7, wherein the first opening is formed by laser drilling.

14. The method of claim 7, wherein the first thermal conductive layer further comprises a material having a thermal conductivity greater than about 1000 W/(m*K).

15. The method of claim 12, wherein the first and second conductive features are through silicon vias (TSVs).

16. A method, comprising:
forming a first semiconductor device structure, comprising:
forming a first device and a second device on a first substrate;
forming a first interconnection structure over the first substrate and the first and second devices;
forming a first opening in the first interconnection structure and in the first substrate between the first and second devices; and
forming a thermal conductive layer in the first openings and on the first substrate, wherein the thermal conductive layer is formed by a single deposition process and covers an entire back side of the first substrate;
forming a second semiconductor device structure, comprising:
forming a third device and a fourth device on a second substrate;
forming a second interconnection structure over the second substrate and the third and fourth devices;
forming a second opening in the second interconnection structure and in the second substrate between the third and fourth devices; and
forming a thermal conductive feature in the second opening; and
bonding the first semiconductor device structure to the second semiconductor device structure, wherein the thermal conductive layer is in contact with the thermal conductive feature.

17. The method of claim 16, wherein the first and second openings are formed by laser drilling.

18. The method of claim 16, further comprising forming a heat sink over the thermal conductive layer.

19. The method of claim 18, further comprising forming a first conductive feature and a second conductive feature in the second substrate, wherein the first conductive feature is in electrical contact with the third device, and the second conductive feature is in electrical contact with the fourth device.

20. The method of claim 19, further comprising forming a first conductive bump and a second conductive bump, wherein the first conductive bump is electrically connected to the first conductive feature, and the second conductive bump is electrically connected to the second conductive feature.

* * * * *